(12) United States Patent
Kohama et al.

(10) Patent No.: US 7,566,500 B2
(45) Date of Patent: Jul. 28, 2009

(54) SURFACE MODIFIED CORUNDUM AND RESIN COMPOSITION

(75) Inventors: Takeshi Kohama, Yokohama (JP); Katsutoshi Kishi, Yokohama (JP)

(73) Assignee: Showa Denko K.K., Tokyo (JP)

( * ) Notice: Subject to any disclaimer, the term of this patent is extended or adjusted under 35 U.S.C. 154(b) by 62 days.

(21) Appl. No.: 11/791,849

(22) PCT Filed: Dec. 5, 2005

(86) PCT No.: PCT/JP2005/022703
§ 371 (c)(1),
(2), (4) Date: May 30, 2007

(87) PCT Pub. No.: WO2006/062210
PCT Pub. Date: Jun. 15, 2006

(65) Prior Publication Data
US 2007/0264493 A1 Nov. 15, 2007

Related U.S. Application Data

(60) Provisional application No. 60/635,602, filed on Dec. 14, 2004.

(30) Foreign Application Priority Data
Dec. 6, 2004 (JP) .............................. 2004-353199

(51) Int. Cl.
*B32B 5/16* (2006.01)
*C08F 299/04* (2006.01)
*C08F 299/08* (2006.01)
*C08L 83/04* (2006.01)
*C08L 83/06* (2006.01)

(52) U.S. Cl. .................. 428/403; 428/327; 428/329; 428/407; 428/448; 523/200; 523/202; 523/212; 523/514; 523/526

(58) Field of Classification Search ................ 428/403, 428/407, 323, 327, 329, 448; 523/200, 202, 523/212, 514, 526
See application file for complete search history.

(56) References Cited

U.S. PATENT DOCUMENTS 6,265,126 B1 * 7/2001 Nishihara et al. ...... 430/108.21
6,337,089 B1 * 1/2002 Yoshioka et al. ............ 424/451
6,830,816 B2 * 12/2004 Mehnert et al. ........... 428/423.1

FOREIGN PATENT DOCUMENTS

| JP | 5132576 A | 5/1993 |
| JP | 11-209618 A | 8/1999 |
| JP | 2001-348488 A | 12/2001 |
| JP | 3290127 B2 | 3/2002 |

* cited by examiner

*Primary Examiner*—H. (Holly) T Le
(74) *Attorney, Agent, or Firm*—Sughrue Mion, PLLC

(57) ABSTRACT

Corundum coated with a silicone compound containing a silicone resin, a resin composition containing the corundum, and an electronic device using an electronic part or semiconductor element, which transmits heat through the resin composition, by which a good affinity between a resin and corundum is obtained and a kneaded product assured of a low viscosity, a uniform dispersibility and when a curable resin is used as the matrix resin, a high curing rate, is yielded so that the handling and moldability of the resin composition can be enhanced.

13 Claims, 1 Drawing Sheet

SURFACE MODIFIED CORUNDUM AND RESIN COMPOSITION

CROSS REFERENCE TO RELATED APPLICATION

This application is an application filed under 35 U.S.C. §111(a) claiming benefit pursuant to 35 U.S.C. §119(e)(1) of the filing date of the Provisional Application No. 60/635,602 filed on Dec. 14, 2004, pursuant to 35 U.S.C. §111(b). This application also claims a priority under 35 U.S.C. §119(b) based on Japanese Patent Application No. 2004-353199 filed on Dec. 6, 2005 and the disclosure thereof is incorporated herein by reference thereto.

TECHNICAL FIELD

The present invention relates to a highly thermal conductive corundum, which is mainly used by filling in plastics, rubbers, greases or the like, and a resin composition using the corundum.

BACKGROUND ART

Conventionally, corundum has been widely used as a filler in rubbers or plastics. For example, the corundum is used as a heat-radiating filler in a silicone resin, a silicone rubber or an epoxy resin. JP-A-H05-132576 and JP-A-2001-348488 disclose a resin composition using alumina particles and having excellent heat conductivity. JP-A-H11-209618 discloses a thermal conductive silicone gel composition containing alumina particles treated with a silane coupling agent. In the case of using the corundum as a heat-radiating filler, the heat-radiating performance is more enhanced by filling a larger amount of corundum in the resin, but an untreated corundum has poor affinity with the resin. The composition has, therefore, a high viscosity and may cause a molding failure when used for molding or an inhibition of curing when dispersed in a curable resin.

An object of the present invention is to obtain good affinity between a resin and corundum by surface-treating the corundum with a silicone compound and yield a kneaded product assured of a low viscosity, a uniform dispersibility and when a curable resin is used as the matrix resin, a high curing rate, so that the handling and moldability of the resin composition can be enhanced.

SUMMARY OF THE INVENTION

The present inventors have made intensive efforts and investigations to attain the above-described object, as a result, the present invention has been accomplished. That is, the present invention includes the followings.

(1) Corundum coated with a silicone compound containing a silicone resin.

(2) Corundum as described in (1) above, wherein the silicone resin comprises at least one of a modified silicone where at least a part of methyl groups in polydimethylsiloxane is replaced by another substituent X (X is an alkoxy group, an epoxy group, an amino group, a carboxyl group or an organic group having an ether bond or the like), and a modified silicone represented by formula (1):

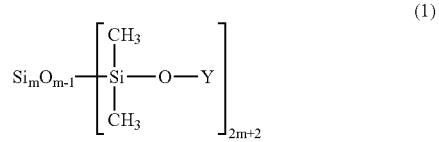

wherein Y is an alkyl group represented by $C_nH_{2n+1}$ (n is an integer from 1 to 8), and m is an integer of 1 or more.

(3) Corundum as described in (1) or (2) above, wherein the silicone compound has a kinematic viscosity of 500 cSt or less.

(4) Corundum as described in any one of (1) to (3) above, wherein the silicone compound contains methylmethoxysiloxane.

(5) Corundum as described in any one of (1) to (3) above, wherein the silicone compound contains polyethoxydimethylsiloxane.

(6) The corundum as described in any one of (1) to (5) above, wherein the corundum has an average secondary particle diameter of 0.1 to 200 μm and a BET specific surface area of 0.01 to 100 $m^2$/g.

(7) The corundum as described in any one of (1) to (6) above, wherein the silicone compound coverage is from 0.01 to 5 mass % based on the corundum.

(8) A resin composition containing the corundum described in any one of (1) to (7) above.

(9) The resin composition as described in (8) above, wherein the resin is at least one species selected from the group consisting of an aliphatic resin, an unsaturated polyester resin, an acrylic resin, a methacrylic resin, a vinyl ester resin, an epoxy resin, a silicone resin and a rubber-based elastomer.

(10) The resin composition as described in (8) or (9) above, wherein the corundum content is from 30 to 95 mass %.

(11) The resin composition as described in any one of (8) to (10), wherein the resin composition is in the sheet form.

(12) The resin composition as described in any one of (8) to (10), wherein the resin composition is in the form of grease or solid.

(13) An electronic part, which transmits heat through the resin composition described in any one of (8) to (12) above.

(14) An electronic device using the electronic part described in (13) above.

(15) A semiconductor element, which transmits heat through the resin composition described in any one of (8) to (12) above.

(16) An electronic device using the semiconductor element described in (15) above.

BEST MODE FOR CARRYING OUT THE INVENTION

Figure 1:
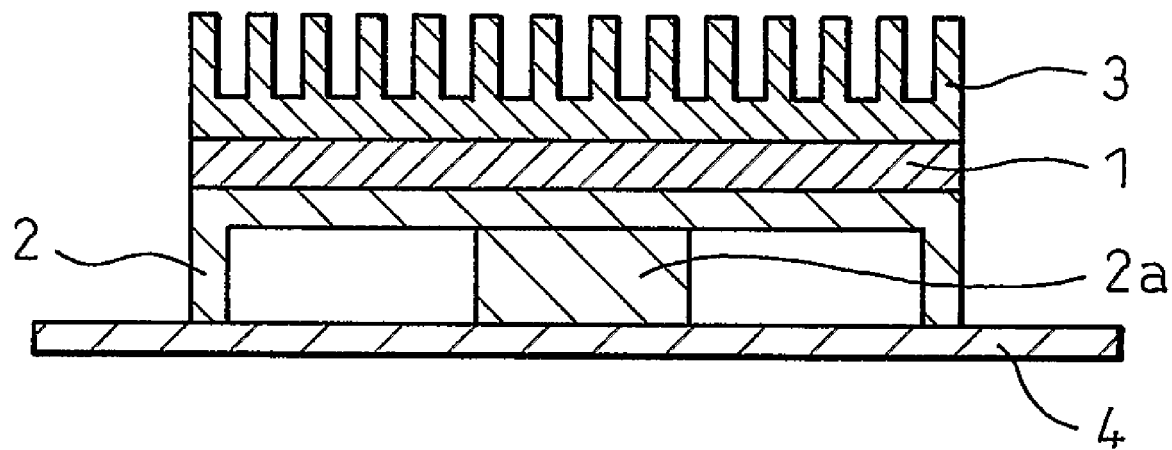
FIG. 1 shows an example of a device comprising a corundum-containing resin composition of the present invention inserted between a heat generating part and a heat releasing component.

The corundum of the present invention is characterized in that the surface thereof is coated with a silicone compound containing a silicone resin. The silicone resin as used in the present invention means a resin having a skeleton comprising bonds formed by alternately bonding oxygen to silicon having an organic group, and examples thereof include a modified silicone where a part of methyl groups in polydimethylsiloxane is replaced by another substituent X (X is an alkoxy group, an epoxy group, an amino group, a carboxyl group or an organic group having an ether bond or the like), and a modified silicone represented by formula (1). In the present invention, such a silicone resin is coated on corundum particles. This is different from a so-called surface treatment with a silane coupling agent generally represented by R—Si(OR')$_3$ (wherein R is a functional group, namely, an aminopropyl group, a glycidoxy group, a methacryloxy group, an N-phenylaminopropyl group, a mercapto group, a vinyl group or another functional group, and R' is a methyl group or an ethyl group). The corundum treated with the silicone resin in the present invention has a better storage stability than that of the corundum treated with the silane coupling agent:

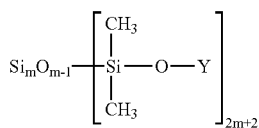

(1)

wherein Y is an alkyl group represented by $C_nH_{2n+1}$ (n is an integer from 1 to 8), and m is an integer of 1 or more.

When corundum subjected to a surface treatment of coating the surface with a silicone compound containing a silicone resin is kneaded with a resin, the corundum content in the composition, that is, the corundum amount capable of filling in the resin, can be increased as compared with the case where a surface-untreated corundum for resin filling is kneaded with a resin. Also, even when the corundum content in the composition is increased, the viscosity of the kneaded product is relatively not elevated and the flexibility of the composition is scarcely lost, as a result, the mechanical resistance and the like of the composition are enhanced. Furthermore, in the case where a curable resin is used as the matrix resin and a surface-untreated corundum is filled therein, curing may not or insufficiently proceed or even if cured, curing takes a very long time, but even in such a case, when the corundum of the present invention is used, curing may be completed in a short time.

As for the silicone compound containing a silicone resin, a silicone resin-containing silicone compound having a kinetic viscosity of 500 cSt or less is preferably used. If the kinetic viscosity exceeds 500 cSt, the affinity to the surface of a corundum particle is worsened and it becomes difficult to uniformly effect the surface treatment.

The silicone resin which can be used is not particularly limited and a known compound may be used. Examples thereof include the above-described modified silicones and among these, more preferred is an alkoxy-modified silicone such as methylmethoxysiloxane and polyethoxy-dimethylsiloxane.

Specific examples of preferred silicone compounds include AY42-163 produced by Dow Corning Toray, and FZ-3704 produced by Nippon Unicar. One of these silicone compounds may be used alone, or two or more thereof may be used in combination.

The corundum for use in the present invention preferably has an average secondary particle diameter of 0.1 to 200 µm, more preferably from 0.3 to 100 µm. With an average particle diameter in this range, an excellent surface smoothness is obtained when a resin composition containing this corundum is used as a sheet material of a heat-radiating sheet or as a substrate material of an MC (metal core) substrate or a printed wiring board. Furthermore, excellent dispersibility in a resin composition is ensured and therefore, the resin composition can have good mechanical strength. If the average particle diameter is less than 0.1 µm, the corundum particles may be difficult to handle or a cohesive force among particles may be increased to lower the dispersibility in a resin composition. On the other hand, if the average particle diameter exceeds 200 µm, the surface smoothness decreases when a resin composition containing this corundum is used as a sheet material of a heat-radiating sheet or as a substrate material of an MC substrate or a printed wiring board.

The corundum of the present invention preferably has a specific surface area of 0.01 to 100 m$^2$/g, more preferably from 0.05 to 10 m$^2$/g, as measured by the BET method. A resin composition using a corundum having a specific surface area in this range is assured of smooth surface, excellent mechanical strength and good dispersibility of corundum in the resin composition.

The method of coating a silicone compound on the corundum is not particularly limited and a known method may be used. Examples thereof include a dry processing method and a wet processing method.

The coverage of a silicone compound or the like on the corundum is preferably from 0.01 to 5 mass %, more preferably from 0.05 to 1 mass %, based on the corundum. If the coverage is less than 0.01 mass %, the covering effect is hardly obtained, whereas if it exceeds 5 mass %, the content of an unreacted silicone compound or the like is increased and this may give rise to a problem that, for example, the unreacted silicone compound remains as an impurity.

The corundum of the present invention is preferably filled in an oil or a polymer compound such as rubber or plastic (in the specification, these are also referred to as "a resin"), and can be suitably used as a highly thermal conductive grease composition, a highly thermal conductive rubber composition or a highly thermal conductive plastic composition. In particular, the corundum content is preferably 80 mass % or more.

Examples of the resin as above include a hydrocarbon-based resin (e.g., polyethylene, ethylene-vinyl acetate copolymer, ethylene-acrylate copolymer, ethylene-propylene copolymer, poly(ethylene-propylene), polypropylene, polyisoprene, poly(isoprene-butylene), polybutadiene, poly(styrene-butadiene), poly(butadiene-acrylonitrile), polychloroprene, chlorinated polypropylene, polybutene, polyisobutylene, olefin resin, petroleum resin, styrol resin, ABS resin, coumarone·indene resin, terpene resin, rosin resin, diene resin); a (meth)acrylic resin (for example, a resin obtained by homopolymerizing a monomer such as methyl (meth)acrylate, ethyl (meth)acrylate, 2-ethylhexyl (meth)-acrylate, n-nonyl (meth)acrylate, (meth)acrylic acid and glycidyl (meth)acrylate, a resin obtained by copolymerizing a plurality of these monomers, a polyacrylonitrile and its copolymer, a polycyanoacrylate, a polyacrylamide and a poly(meth)acrylate salt); a vinyl acetate and vinyl alcohol-based resin (e.g., vinyl acetate resin, polyvinyl alcohol, polyvinyl acetal-based resin, polyvinyl ether); a halogen-containing resin (e.g., vinyl chloride resin, vinylidene chloride resin, fluorine-based resin); a nitrogen-containing vinyl resin (e.g., polyvinylcarbazole, polyvinylpyrrolidone, polyvinylpyridine, polyvinylimidazole); a diene-based polymerization product (e.g., butadiene-based synthetic rubber, chloroprene-based synthetic rubber, isoprene-based synthetic rubber); polyethers (e.g., polyethylene glycol, polypropylene glycol, hydrin rubber, penton resin); a resin of polyethyleneimines; a phenolic resin (e.g., phenol·formalin resin, cresol·formalin resin, modified phenol resin, phenol·furfural resin, resorcin resin); an amino resin (e.g., urea resin, modified urea resin, melamine resin, guanamine resin, aniline resin, sulfonamide resin); an aromatic hydrocarbon-based resin (e.g., xylene-formaldehyde resin, toluene·formalin resin); a ketone resin (e.g., cyclohexanone resin, methyl ethyl ketone resin); a saturated alkyd resin; an unsaturated polyester resin (e.g., maleic anhydride-ethylene glycol polycondensate, maleic anhydride-phthalic anhydride-ethylene glycol poly-condensate); an allyl phthalate resin (for example, a resin obtained by crosslinking an unsaturated polyester resin with diallyl phthalate); a vinyl ester resin (for example, a resin obtained by crosslinking a primary polymer having a highly reactive acryl double bond at the terminal and a bisphenol A-based ether bond in the main chain, with styrene, an acryl ester or the like); an allyl ester resin; a polycarbonate; a polyphosphoric ester resin; a polyamide resin; a polyimide resin; a silicone resin (for example, a silicone oil (e.g., polydimethylsiloxane), a silicone rubber, a silicone resin, and a reactive silicone resin having a hydrosiloxane, hydroxysiloxane, alkoxysiloxane or vinylsiloxane structure in the molecule and undergoing curing by the effect of a catalyst or heat); a furan resin; a polyurethane resin; a polyurethane rubber; an epoxy resin (for example, a resin using a condensate of bisphenol A and epichlorohydrin, a condensate of novolak-type phenol resin and epichlorohydrin, or a condensate of polyglycols and epichlorohydrin); a phenoxy-type resin; and a modified product thereof. One of these may be used alone or a plurality of these may be used in combination.

Among these resins, more preferred are an unsaturated polyester resin, an acrylic resin, a methacrylic resin, a vinyl ester resin, an epoxy resin and a silicone resin.

Such a resin may have a low molecular weight or a high molecular weight and may be in a rubbery or glassy state or may be a cured product. These conditions may be freely selected depending on the usage or environment on use.

Furthermore, the resin is preferably an oily substance. The grease obtained by mixing the corundum of the present invention with an oil advantageously follows the unevenness of a heating element and a heat-radiating element and at the same time, allows for a small distance therebetween, so that the heat-radiating effect can be more enhanced.

The oil which can be used for the above and other purposes is not particularly limited and a known oil may be used. Examples thereof include a silicone oil, a petroleum-based oil, a synthetic oil and a fluorine-based oil.

The corundum coated with a silicone compound of the present invention has a high affinity with a general resin and can be filled in a general resin in a higher amount in comparison with corundum without a coating, but a silicone compound, for example, a curable silicone oil such as two components room temperature curable potting gel (TSE 3070 soled by GE Toshiba Silicone) is of course particularly preferred as the silicone compound generally has a higher affinity with the silicone resin.

The composition of the present invention may have a solid form such as a sheet or a grease form. The sheet or grease is interposed between a heat-generating portion of, for example, an electronic part or a semiconductor element and a heat-radiating component or plate, whereby heat generated can be efficiently transmitted and radiated through the composition of the present invention. By such a manner, thermal deterioration or the like of the electronic part or semiconductor element can be decreased and the electronic part or semiconductor element or an electronic device using such a part or element can be reduced in the failure and prolonged in the life. Examples of such a part, element or device include a computer and CPU (central processing unit) thereof, PDP (plasma display panel), a battery (e.g., lead storage battery, secondary battery, capacitor) and a peripheral device thereof (a device used for a hybrid electric car or the like by providing a thermal conductive composition between a secondary battery and a heat-radiating element to control the temperature and stabilize the battery properties), a radiator of electric motor, a Peltier element, an inverter, a (high) power transistor, and a high-brightness LED.

FIG. 1 shows an example of a device comprising a heat releasing sheet 1 of a corundum-containing resin composition of the present invention inserted between a package 2 including a heat generating part such as an electronic component or a semiconductor element (CPU, etc.) and a heat releasing component or a heat radiator 3, by which generated heat is effectively conducted and released through the resin composition of the present invention. Reference 4 denotes a substrate.

EXAMPLES

The present invention is described in greater detail below by referring to Examples and Comparative Examples, but the present invention is not limited to these Examples.

Examples 1 to 9

In a 20 L-volume Henschel mixer (HENSCHEL NP2 FM20B, manufactured by Mitsui Miike Kakoki K.K.), 7 kg of corundum having a predetermined average particle diameter and a predetermined BET specific surface area was charged and while mixing it, a predetermined amount (Examples 1, 2 and 4 to 9: 35 g, Example 3: 70 g) of a silicone compound in the level shown in Table 1 was added and mixed at 110° C. for 1 hour to obtain surface-treated corundum.

Subsequently, 60 g of the surface-treated corundum and 20 g of a silicone oil (Two component room temperature silicone potting gel TSE3070 Solution A (10 g)+Solution B (10 g), produced by GE Toshiba Silicones, Co., Ltd.; Solution A is a mixture of polyalkenylsiloxane and a platinum compound, Solution B is a mixture of polyalkenylsiloxane, polyalkylhydrogensiloxane and a reaction adjusting agent) were mixed in a defoaming kneader (NO-BUBBLING NBK-2, manufactured by Nippon Seiki Co., Ltd.) at 750 rpm for 5 minutes to obtain a resin composition. The obtained resin composition was held in air at 100° C. for 1 hour, thereby effecting a curing test.

As a result of the curing test, good cured state was obtained in all samples.

Also, 300 g of the surface-treated corundum was filled in 100 g of a silicone oil (TSE3070 Solution A (10 g)+Solution B (10 g), produced by GE Toshiba Silicones, Co., Ltd.), and the viscosity was measured at 25° C. by a BS-type viscometer (manufactured by Tokyo Keiki Co., Ltd.).

Reference Examples 1 to 6 and Comparative Example 1

A surface treatment and a curing test were performed under the same conditions as in Examples. The amount of the silicone compound at the surface treatment was 35 g in Reference Examples 1 to 4, 0.035 g in Reference Example 5 or 420 g in Reference Example 6. In Comparative Example 1, the curing test was performed by using surface-untreated corundum.

In the case where the surface was not coated with a silicone compound (Comparative Example 1), the resin composition was not cured.

Even when a silicone compound was coated on the surface, if an appropriate silicone compound was not used, the resin composition was not cured (Reference Examples 2 and 3), was insufficiently cured (Reference Example 1) or was excessively cured and became unusable as a rubber (Reference Example 4). In Reference Example 5 where the amount of the silicone compound was small, the curing property was slightly low, whereas in Reference Example 6 where the amount of the silicone compound was large, the powder was aggregated at the surface treatment and the resin composition was liable to be non-uniformly cured.

In Examples 1 to 9 where an appropriate amount of an alkoxy-modified silicone was used as the silicone compound, good curing was achieved as compared with Reference Examples 1 to 4 using a non-modified silicone or other modified silicones.

As a result of measurement of viscosity, in the case of adding a silicone compound in a certain amount or more (Examples 1 and 3 and Reference Example 6), the viscosity was greatly decreased as compared with the case where a silicone compound was not added (Comparative Example 1) or added in a small amount (Reference Example 5). This reveals that a larger amount of corundum can be filled in a resin by surface-treating the corundum with a silicone compound.

In Examples above, corundum particles treated with a silicone compound were added to a curable silicone oil, but even when the corundum is added to other curable or non-curable (thermoplastic) matrix resins, good moldability can be obtained by appropriately selecting the silicone compound according to the resin.

TABLE 1

| | Silicone Compound | Average Particle Diameter and BET Specific Surface Area of Corundum | Amount Added of Silicone Compound | Curing Test Result | Viscosity |
|---|---|---|---|---|---|
| Example 1 | methylmethoxysiloxane (silicone resin) (AY42-163, produced by Dow Corning Toray), kinetic viscosity: 15 cSt | 43 µm, 0.4 m$^2$/g | 0.5% | AA | 1920 P |
| Example 2 | polyethoxydimetylsiloxane (FZ-3704, produced by Nippon Unicar), kinetic viscosity: 7 cSt | 43 µm, 0.4 m$^2$/g | 0.5% | AA | |
| Example 3 | methylmethoxysiloxane (silicone resin) (AY42-163, produced by Dow Corning Toray), kinetic viscosity: 15 cSt | 43 µm, 0.4 m$^2$/g | 1.0% | AA | 1850 P |
| Example 4 | methylmethoxysiloxane (silicone resin) (AY42-163, produced by Dow Corning Toray), kinetic viscosity: 15 cSt | 0.4 µm, 7.4 m$^2$/g | 0.5% | AA | |
| Example 5 | methylmethoxysiloxane (silicone resin) (AY42-163, produced by Dow Corning Toray), kinetic viscosity: 15 cSt | 1.5 µm, 1.9 m$^2$/g | 0.5% | AA | |
| Example 6 | methylmethoxysiloxane (silicone resin) (AY42-163, produced by Dow Corning Toray), kinetic viscosity: 15 cSt | 5.4 µm, 0.8 m$^2$/g | 0.5% | AA | |
| Example 7 | methylmethoxysiloxane (silicone resin) (AY42-163, produced by Dow Corning Toray), kinetic viscosity: 15 cSt | 11 µm, 1.9 m$^2$/g | 0.5% | AA | |
| Example 8 | methylmethoxysiloxane (silicone resin) (AY42-163, produced by Dow Corning Toray), kinetic viscosity: 15 cSt | 20 µm, 0.9 m$^2$/g | 0.5% | AA | |
| Example 9 | methylmethoxysiloxane (silicone resin) (AY42-163, produced by Dow Corning Toray), kinetic viscosity: 15 cSt | 75 µm, 0.1 m$^2$/g | 0.5% | AA | |
| Reference Example 1 | dimethyl silicone oil (SH200(M), produced by Dow Corning Toray), kinetic viscosity: 100 cSt | 43 µm, 0.4 m$^2$/g | 0.5% | BB | |
| Reference Example 2 | silanol-modified silicone oil (L-9000, produced by Nippon Unicar), kinetic viscosity: 100 cSt | 43 µm, 0.4 m$^2$/g | 0.5% | DD | |
| Reference Example 3 | amino-modified silicone oil (BY16-853U, produced by Dow Corning Toray), kinetic viscosity: 13 cSt | 43 µm, 0.4 m$^2$/g | 0.5% | DD | |
| Reference Example 4 | methylhydrogen silicone oil (SH1107, produced by Dow Corning Toray), kinetic viscosity: 20 cSt | 43 µm, 0.4 m$^2$/g | 0.5% | CC | |
| Reference Example 5 | methylmethoxysiloxane (silicone resin) (AY42-163, produced by Dow Corning Toray), kinetic viscosity: 15 cSt | 43 µm, 0.4 m$^2$/g | 0.005% | BB | 2860 P |
| Reference Example 6 | methylmethoxysiloxane (silicone resin) (AY42-163, produced by Dow Corning Toray), kinetic viscosity: 15 cSt | 43 µm, 0.4 m$^2$/g | 6.0% | BB | 1980 P |
| Comparative Example 1 | none | 43 µm, 0.4 m$^2$/g | none | DD | 8420 P |

AA: Good curability.
BB: Insufficiently cured.
CC: Excessively cured.
DD: Not cured.

INDUSTRIAL APPLICABILITY

The corundum of the present invention can be filled in a resin in a higher amount, with a reduced viscosity and a uniform dispersion, and when a resin composition in which the corundum is filled is disposed, for example, between a heat generating part of an electronic component or a semiconductor element and a heat releasing component or a heat radiator, heat conduction and heat release can be improved. Thus, the corundum and resin composition of the present invention are useful in industries.

The invention claimed is:

1. Corundum coated with a silicone compound containing at least one of methylmethoxysiloxane or polyethoxydimethylsiloxane.

2. Corundum according to claim 1, wherein the silicone compound has a kinematic viscosity of 500 cSt or less.

3. The corundum according to claim 1, wherein the corundum has an average secondary particle diameter of 0.1 to 200 µm and a BET specific surface area of 0.01 to 100 m$^2$/g.

4. The corundum according to claim 1, wherein the silicone compound coverage is from 0.01 to 5 mass% based on the corundum.

5. A resin composition containing the corundum described in claim 1.

6. The resin composition according to claim 5, wherein the resin is at least one species selected from the group consisting of an aliphatic resin, an unsaturated polyester resin, an acrylic resin, a methacrylic resin, a vinyl ester resin, an epoxy resin, a silicone resin and a rubber-based elastomer.

7. The resin composition according to claim 5, wherein the corundum content is from 30 to 95 mass %.

8. The resin composition according to claim 5, wherein the resin composition is in the sheet form.

9. The resin composition according to claim 5, wherein the resin composition is in the form of grease or solid.

10. An electronic part, which transmits heat through the resin composition according to claim 5.

11. An electronic device using the electronic part according to claim 10.

12. A semiconductor element, which transmits heat through the resin composition according to claim 5.

13. An electronic device using the semiconductor element according to claim 12.

* * * * *